(12) United States Patent
Li (10) Patent No.: US 7,667,540 B2
(45) Date of Patent: Feb. 23, 2010

(54) CLASS-AB DRIVER DESIGN WITH IMPROVED FREQUENCY RESPONSE

(75) Inventor: Shengyuan Li, Irving, TX (US)

(73) Assignee: Texas Instruments Incorporated, Dallas, TX (US)

( * ) Notice: Subject to any disclaimer, the term of this patent is extended or adjusted under 35 U.S.C. 154(b) by 170 days.

(21) Appl. No.: 11/971,214

(22) Filed: Jan. 9, 2008

(65) Prior Publication Data

US 2009/0146696 A1 Jun. 11, 2009

Related U.S. Application Data

(60) Provisional application No. 60/996,921, filed on Dec. 11, 2007.

(51) Int. Cl.
*H03F 3/26* (2006.01)
(52) U.S. Cl. .................................. 330/267; 330/273
(58) Field of Classification Search .............. 330/264, 330/267, 273
See application file for complete search history.

(56) References Cited

U.S. PATENT DOCUMENTS

| | | | |
|---|---|---|---|
| 6,657,495 B2 * | 12/2003 | Ivanov et al. | 330/255 |
| 6,657,496 B2 * | 12/2003 | Chen et al. | 330/263 |
| 7,253,685 B2 * | 8/2007 | Chung | 330/255 |
| 7,271,653 B2 * | 9/2007 | Chung | 330/255 |
| 7,548,114 B2 * | 6/2009 | Yu | 330/255 |

* cited by examiner

*Primary Examiner*—Henry K Choe
(74) *Attorney, Agent, or Firm*—John J. Patti; Wade J. Brady, III; Frederick J. Telecky, Jr.

(57) ABSTRACT

A class-AB driver design with improved frequency response is disclosed. In one embodiment, the class-AB driver includes a push-pull output stage, a trans-linear loop, an input stage, a current biasing and enabling circuit. Further, the trans-linear loop is coupled to a signal input terminal $AB_{IN}$ via node A, and the push-pull output stage is coupled to the trans-linear loop via node B and node C. Further, the trans-linear loop includes a speed balancing resistor RB in a faster signal traveling path (i.e., $AB_{IN}$ to $AB_{OUT}$ via node A and B) to match up the speed with a slower signal traveling path (i.e., $AB_{IN}$ to $AB_{OUT}$ via node A and C). In another embodiment, the MOS transistors are also used instead of the speed balancing resistor RB to balance the signal traveling time of the two signal traveling paths.

15 Claims, 5 Drawing Sheets

CLASS-AB DRIVER DESIGN WITH IMPROVED FREQUENCY RESPONSE

RELATED APPLICATIONS

Benefit is claimed under 35 U.S.C. 119(e) to U.S. Provisional Applications Ser. 60/996,921, entitled "A Class-AB Driver Design with Improved Frequency Response" by Shengyuan Li, filed on 11 Dec. 2007 which is herein incorporated in its entirety by reference for all purposes.

TECHNICAL FIELD OF THE INVENTION

The present invention relates generally to class-AB drivers, and more particularly relates to high-speed class-AB drivers for wideband applications.

BACKGROUND OF THE INVENTION

Generally, class-AB drivers are used to deliver power to small resistors, such as audio amplifiers and/or large capacitors, such as power amplifiers. Typically, these class-AB drivers are required to have rail-to-rail output swing, low quiescent power, large driver capability, high speed and low distortion, etc. However, tradeoffs between these requirements are to be made to get a desired performance. For example, for a given capacitive load, to get sufficient speed, the trans-conductance (gm) has to be increased as the pole is generally in the form of gm/C. Depending on the application, other additional requirements may be added. For wideband applications, such as the one using the whole High Frequency (HF)/Very High Frequency (VHF) Industrial, Scientific and Medical (ISM) band, the additional requirements can be the low in-band attenuation and the high out-band attenuation.

For example, a typical class-AB driver used to deliver power to the small resistors and/or large capacitors may include a push pull output stage, a trans-linear loop, an input stage, a current biasing and enabling circuit, and a VGS (Voltage difference between Gate and Source) multiplier circuit. In typical class AB drivers, the trans-linear loop formed by complementary transistors of CMOS type or Bipolar type, etc. are used for easy biasing implementation and improved linearity by reducing crossover distortion. However, the trans-linear loop of the class AB drivers generates a left-half-plane (LHP) zero due to the imbalance between two signals traveling paths. One signal traveling path (e.g., upper path) starts from input terminal node of the class-AB driver to input node of the trans-linear loop (e.g., say node A) and arrives at an output terminal node via a node (e.g., say node B). The other signal traveling path (e.g., lower path) starts from input terminal node to the node A and arrives at the output terminal node via another node (e.g., say node C). However, the two signal traveling paths may have different speeds with one being faster than the other. Thus, when the two signals coming via the two signal traveling paths are combined, a close-in LHP zero is formed which may significantly reduce the class-AB driver's frequency response performance.

SUMMARY OF THE INVENTION

A novel technique for a class-AB driver with improved frequency response is disclosed. According to an aspect of the subject matter, the class-AB driver includes a push-pull output stage, a trans-linear loop having a speed balancing resistor RB, an input stage, a current biasing and enabling circuit. In some embodiments, the trans-linear loop is coupled to a signal input terminal $AB_{IN}$ via a node A, and the push-pull output stage is coupled to the trans-linear loop via node B and node C.

Further, delivering current/power using the class-AB driver includes receiving a lower signal via a lower signal path starting from the $AB_{IN}$ and arriving at $AB_{OUT}$ via the node A and the node C, and receiving an upper signal via a upper signal path starting from the $AB_{IN}$ and arriving at the $AB_{OUT}$ via the node A, RB, and the node B. In these embodiments, the size of the RB is selected such that the upper signal has substantially same signal travel time as the lower signal to arrive at $AB_{OUT}$.

According to another aspect of the subject matter, the class-AB driver includes the push-pull output stage, a trans-linear loop (having a tenth transistor M10 and an eleventh transistor M11), the input stage, the current biasing and enabling circuit. In some embodiments, the trans-linear loop is coupled to the signal input terminal $AB_{IN}$ via the node A, and the push-pull output stage is coupled to the trans-linear loop via the node B and node C.

Further, delivering current/power using the class-AB driver includes receiving a lower signal via a lower signal path starting from the $AB_{IN}$ and arriving at $AB_{OUT}$ via the node A and the node C, and receiving an upper signal via a upper signal path starting from the $AB_{IN}$ and arriving at the $AB_{OUT}$ (via the node A, M10, M11, and the node B). In these embodiments, the sizes of the transistors (M10 and M11) are selected such that the upper signal has substantially the same signal travel time as the lower signal to arrive at the $AB_{OUT}$.

BRIEF DESCRIPTION OF THE DRAWINGS

Example embodiments are illustrated by way of example and not limitation in the figures of the accompanying drawings, in which like references indicate similar elements and in which.

Other features of the present embodiments will be apparent from the accompanying drawings and from the detailed description that follows.

DETAILED DESCRIPTION OF THE INVENTION

A novel technique for a class-AB driver with improved frequency response is disclosed. In the following detailed description of the embodiments of the invention, reference is made to the accompanying drawings that form a part hereof, and in which are shown by way of illustration specific embodiments in which the invention may be practiced. These embodiments are described in sufficient detail to enable those skilled in the art to practice the invention, and it is to be understood that other embodiments may be utilized and that changes may be made without departing from the scope of the present invention. The following detailed description is, therefore, not to be taken in a limiting sense, and the scope of the present invention is defined only by the appended claims.

Figure 1:
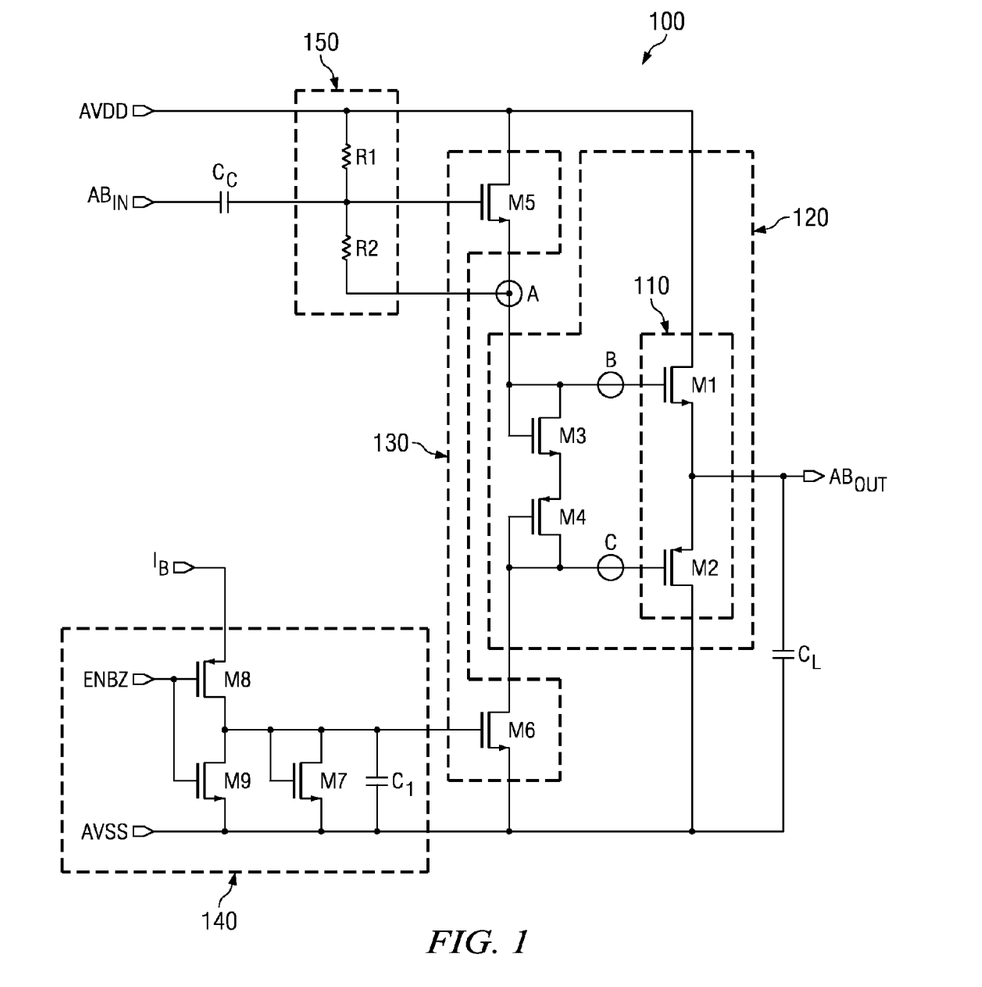
FIG. 1 illustrates a circuit diagram of a low-distortion class-AB driver in the context of the invention.

FIG. 1 illustrates a circuit diagram of a low-distortion class-AB driver 100 in the context of the invention. The class-AB driver 100 shown in FIG. 1 includes a push-pull output stage 110, a trans-linear loop 120, an input stage 130, a current biasing and enabling circuit 140, and a VGS (Voltage difference between Gate and Source) multiplier circuit 150. As shown in FIG. 1, the push-pull output stage 110 is formed by transistors M1 and M2 to output current to charge/discharge capacitor $C_L$. The trans-linear loop 120 is formed by transistors M1, M2, M3 and M4 for easy biasing implementation and improved linearity by reducing crossover distortion.

The input stage 130 is formed by transistors M5 and M6 which can be configured in at least four different ways. FIG. 1 shows the input stage 130 in N-channel metal-oxide semiconductor (NMOS) follower configuration for obtaining a high capacitive buffering function. Based on a previous stage's output DC level, the NMOS follower can be configured by receiving the input at the gate of a P-channel metal-oxide semiconductor (PMOS) M6 and biasing current at a PMOS M5. The input stage 130 can also be configured as a common source amplifier to get some gain. This can be achieved by either taking input at the gate of PMOS M5 and biasing current from the NMOS M6 or taking input at the gate of NMOS M6 and biasing current from the PMOS M5.

In addition as shown in FIG. 1, the current biasing and enable circuit 140 is formed by transistors M7, M8 and M9 and a capacitor C1 for bypassing. The biasing current $I_B$ is preferably taken from some band-gap reference, and supply source AVDD is preferably connected to some internal regulated stable voltage source for an improved power supply rejection (PSR) performance. Further as shown in FIG. 1, the VGS multiplier circuit 150 is formed by resistors R1 and R2 to bias the input stage source follower transistor M5 and accommodate the incoming AC signal.

In operation, an input signal travels from node $AB_{IN}$ to $AB_{OUT}$ through two different signal traveling paths. However, it can be seen that the trans-linear loop 120 shown in FIG. 1 generates a left-half-plane (LHP) zero, due to the imbalance between two signals traveling paths. One signal traveling path (e.g., upper path) starts from the input terminal node $AB_{IN}$ to node A and arriving at the output $AB_{OUT}$ via node B. The other signal traveling path (e.g., lower path) starts from the input terminal node $AB_{IN}$ to the node A and arriving at the output $AB_{OUT}$ via node C. It can be seen that the two signal traveling paths have different speeds with one being faster than the other.

When the two signals coming via the two signal traveling paths are combined, a close-in LHP zero is formed which significantly reduces the class-AB driver's frequency response performance. For example, the imbalance between the two signal traveling paths results in drooping in-band frequency response and low out-of-band attenuation. In the example embodiment illustrated in FIG. 1, the signal travels faster in the upper path when compared to the lower path. Therefore, it is desirable to cancel the close-in LHP zero by balancing the two signal paths in order to improve the frequency response performance of the class-AB driver.

Figure 2:
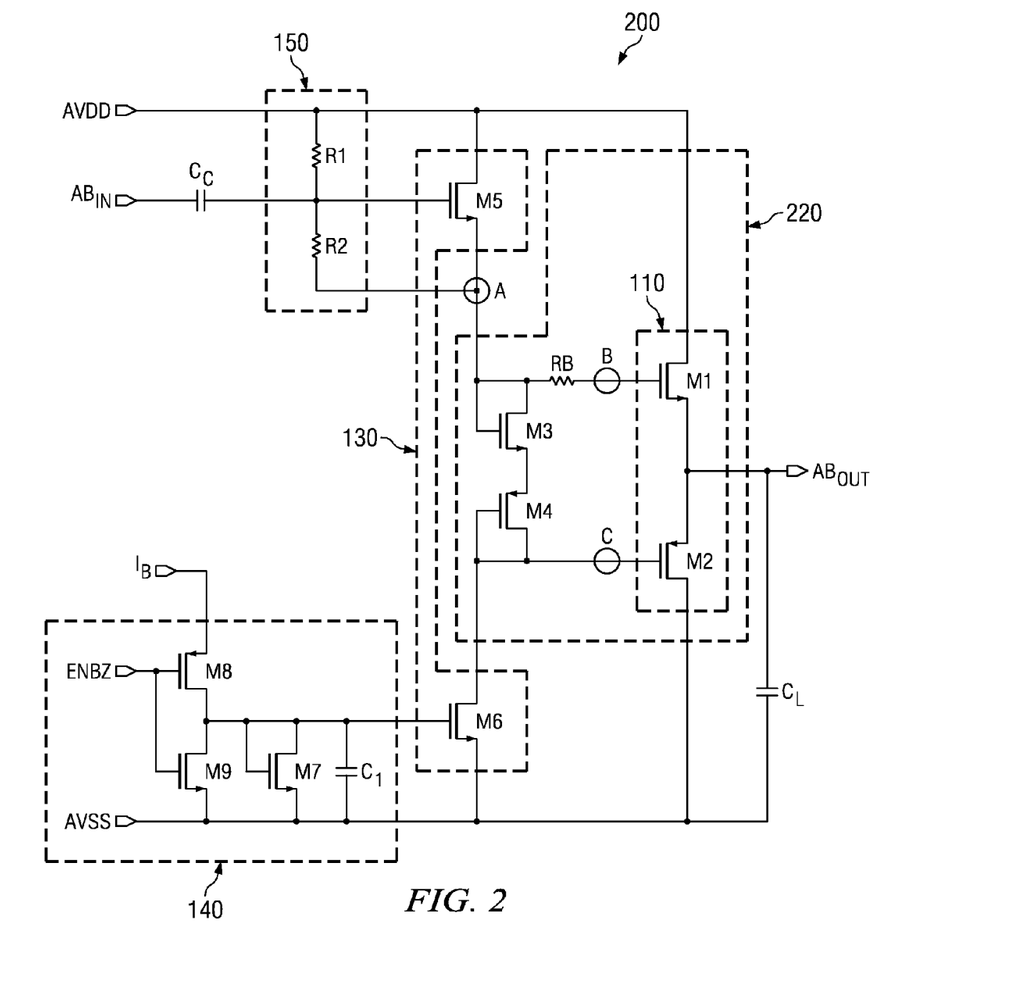
FIG. 2 is a circuit diagram of a class-AB driver, according to an embodiment.

FIG. 2 is a circuit diagram of a class-AB driver 200, according to an embodiment of the present invention. Particularly, the class-AB driver 200 includes a push-pull output stage 110, a trans-linear loop 220, an input stage 130, a current biasing and enabling circuit 140, and a VGS multiplier circuit 150. The class-AB driver 200 having a signal input terminal $AB_{IN}$, and a signal output terminal $AB_{OUT}$ includes the push-pull output stage 110 coupled to the signal output terminal. The push-pull output stage 110 includes a first transistor M1 having a first electrode, a second electrode and a control electrode and a second transistor M2 having a first electrode, a second electrode, and a control electrode. In these embodiments, the second electrode of the M1 and the first electrode of the M2 are coupled to the $AB_{OUT}$ as shown in FIG. 2.

Further as shown in FIG. 2, the class-AB driver 200 also includes the trans-linear loop 220 including the push-pull output stage 110. Further, the trans-linear loop 220 includes a third transistor M3 having a first electrode, a second electrode and a control electrode, a fourth transistor M4 having a first electrode, a second electrode and a control electrode, and a speed balancing resistor RB having an input and an output. As shown in FIG. 2, the control electrode of the M3, the input of RB and the $AB_{IN}$ are coupled at node A, the output of the RB is coupled to the control electrode of the M1 at node B, and the second electrode of the M4 and the control electrode of the M2 are coupled at node C. Also, the second electrode of the M3 is coupled to the first electrode of the M4.

The class-AB driver 200 also includes the input stage 130 coupled to the $AB_{IN}$ and the trans-linear loop 220. In these embodiments, the input stage 130 includes a fifth transistor M5 having a first electrode, a second electrode and a control electrode and a sixth transistor M6 having a first electrode, a second electrode and a control electrode and where the second electrode of the M5 is coupled to the node A and the first electrode of the M6 is coupled to the control electrode of the M4.

Further as shown in FIG. 2, the class-AB driver 200 includes the current biasing and enabling circuit 140 coupled to the input stage 130 and the signal output terminal $AB_{OUT}$. Also, the control electrode of the M6 is coupled to the current biasing and enabling circuit 140 and the control electrode of the M5 is coupled to the $AB_{IN}$. As illustrated above, the VGS multiplier circuit 150 is formed by resistors R1 and R2 to bias the input stage source follower transistor M5 and accommodate an incoming AC signal.

In these embodiments, an upper signal path starting from $AB_{IN}$ and arriving at $AB_{OUT}$ via the node A, RB and the node B, and a lower signal path starting from $AB_{IN}$ and arriving at the $AB_{OUT}$ via the node A and the node C have substantially similar signal travel time.

In some embodiments, the transistors M1 and M3 are the same one type of transistors, and M2 and M4 are the same complementary type of transistors and the exemplary transistors M1, M2, M3 and M4 are CMOS transistors, bipolar transistors, and the like. Also, the exemplary transistors M5 and M6 are CMOS transistors and bipolar transistors.

In one embodiment, the signal traveling paths are balanced by adding a speed balancing resistor RB in the faster signal traveling path (i.e., the upper path) to match up the speed with the slower signal traveling path (i.e., the lower path). As illustrated in FIG. 2, the speed balancing resistor RB used to balance the two signal traveling paths is connected between the nodes A and B to compensate resistance caused due to the transistors M3 and M4.

In one example embodiment, by adding the speed balancing resistor RB between the nodes A and B, a new pole is created to cancel out the left half plane (LHP) close-in zero, which is the root cause for drooping in-band frequency response and low out-of-band attenuation. Therefore, the drooping of the in-band frequency and low out-band attenuation of the class-AB driver 200 are improved. As a result, the frequency response performance of the class-AB driver 200 is improved.

Figure 3:
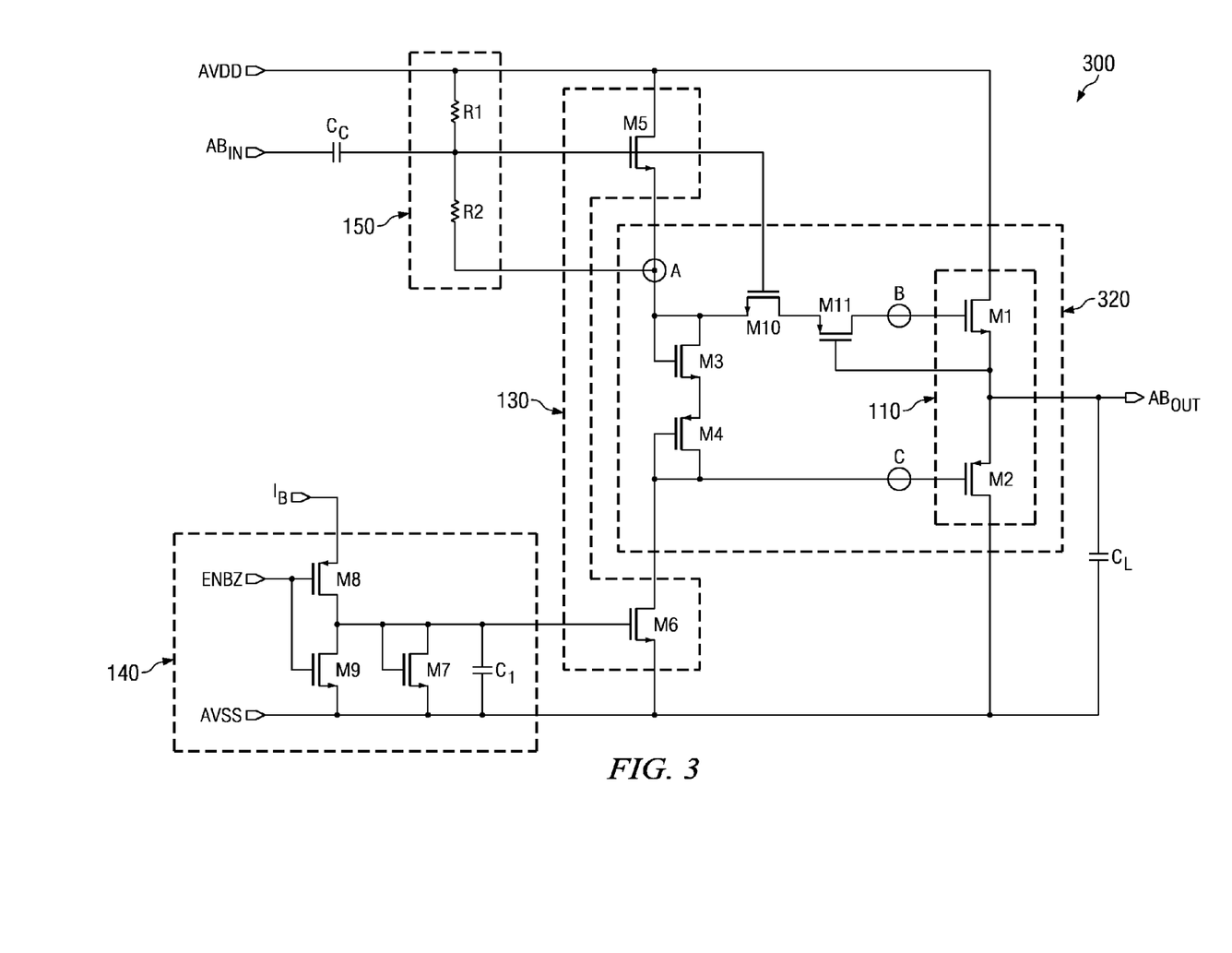
FIG. 3 is a circuit diagram of another class-AB driver, according to an embodiment.

FIG. 3 is another circuit diagram of class-AB driver 300, according to one embodiment. Particularly, the class-AB driver 300 having a signal input terminal $AB_{IN}$, and a signal output terminal $AB_{OUT}$, includes the push-pull output stage 110 coupled to the signal output terminal $AB_{OUT}$. In some embodiments, the push-pull output stage 110 includes a first transistor M1 having a first electrode, a second electrode and a control electrode and a second transistor M2 having a first electrode, a second electrode, and a control electrode. Further, the second electrode of the M1 and the first electrode of the M2 are coupled to the $AB_{OUT}$.

The class-AB driver 300 also includes a trans-linear loop 320 including the push-pull output stage 110. The trans-linear loop 320 also includes a third transistor M3 having a first electrode, a second electrode and a control electrode, a fourth transistor M4 having a first electrode, a second electrode and a control electrode, a tenth transistor M10 having a first electrode, a second electrode and a control electrode, and a eleventh transistor M11 having a first electrode, a second electrode and a control electrode. In these embodiments, the control electrode of the M3, the second electrode of M10 and the $AB_{IN}$ are coupled at node A, whereas the second electrode of M11 is coupled to the control electrode of the M1 at node B, and the second electrode of the M4 and the control electrode of the M2 are coupled at node C. The second electrode of M3 is coupled to the first electrode of M4 and the first electrode of M10 is coupled to the first electrode of M11.

The class-AB driver 300 further includes the input stage 130 coupled to the $AB_{IN}$, and the trans-linear loop 320. The input stage 130 includes a fifth transistor M5 having a first electrode, a second electrode and a control electrode and a sixth transistor M6 having a first electrode, a second electrode and a control electrode, where the second electrode of M5 is coupled to node A, and first electrode of M6 is coupled to the control electrode of M4.

The class-AB driver 300 also includes the current biasing and enabling circuit 140 coupled to the input stage 130 and the signal output terminal. The control electrode of M6 is coupled to the current biasing and enabling circuit 140 and the control electrode of M5 is coupled to the $AB_{IN}$. In some embodiments, the transistors M1, M3, M5, M6, and M10 are the same one type of transistors and M2, M4 and M11 are the same complementary type of transistors and the exemplary transistors M1, M2, M3, M4, M5, M6, M10 and M11 are CMOS transistors, bipolar transistors, and the like.

In the example embodiment illustrated in FIG. 3, an upper signal path starting from the $AB_{IN}$ and arriving at the $AB_{OUT}$ via the node A, M10, M11, and the node B and a lower signal path starting from the $AB_{IN}$ and arriving at the $AB_{OUT}$ via the node A and the node C have substantially similar signal travel time.

In another embodiment, the signal traveling paths are also balanced by adding MOS transistors M10 and M11 in the faster signal traveling path (i.e., the upper path) to match up the speed with the slower signal traveling path (i.e., the lower path). In these embodiments, the transistors M10 and M11 are used to track the transistors M3 and M4 as shown in FIG. 3.

As illustrated in FIG. 3, the transistors M10 and M11 are connected between the nodes A and B, to compensate the resistance caused due to the transistors M3 and M4. Further, the transistors M10 and M11 are used instead of RB (e.g., as illustrated in FIG. 2) based on the fact that the resistance of a MOS transistor at triode region is approximately equal to its transconductance ($g_m$) inverse at saturation region. In these embodiments, the implementation of transistors M10 and M11 instead of speed balancing resistor RB enables better tracking of delay across process, voltage and temperature variations.

In accordance with the above described procedure, delivering current/power using the class-AB driver 300 includes receiving a lower signal via a lower signal path starting from the $AB_{IN}$ and arriving at the $AB_{OUT}$ via the node A and the node C, and receiving an upper signal via a upper signal path starting from the $AB_{IN}$ and arriving at the $AB_{OUT}$ via the node A, M10, M11, and the node B. In these embodiments, the sizes of the M10 and M11 are selected such that the upper signal has substantially same signal travel time as the lower signal to arrive at the $AB_{OUT}$.

Figure 4:
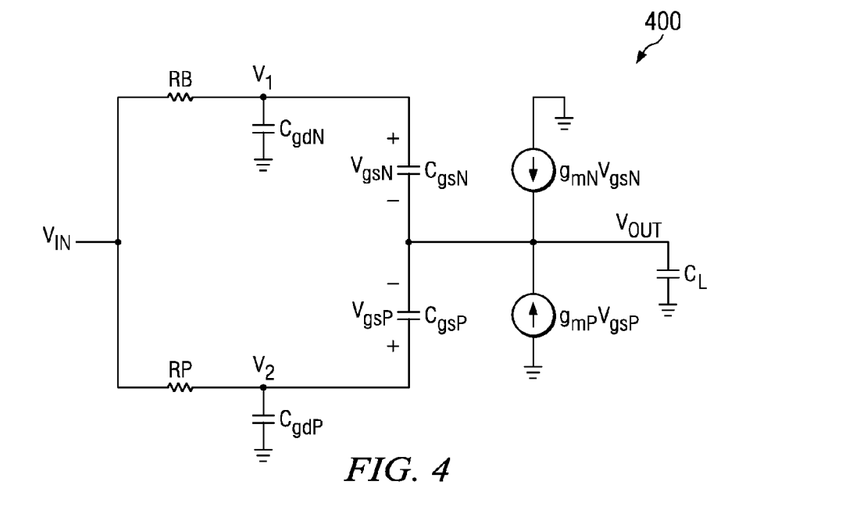
FIG. 4 is a circuit diagram of a simplified AC model for the core part of the class-AB driver shown in FIG. 2, according to an embodiment.

FIG. 4 is a circuit diagram of a simplified AC model 400 for the core part of the class-AB driver 200 shown in FIG. 2, according to an embodiment. Particularly, FIG. 4 illustrates the simplified AC model 400 of the trans-linear loop 220 of the class-AB driver 200. As shown in FIG. 4, $V_{IN}$ is the node A of FIG. 2, $V_1$ is the voltage at the node B, V2 is the voltage at the node C. Let RP be the equivalent resistance due to the transistors M3 and M4. Let $C_{dgN}$ and $C_{dgP}$ refer to the lumped capacitance at the node B and C.

Further, the transistor M1 is modeled by $C_{gsN}$ and a voltage controlled current source $g_{mN}*V_{gsN}$. Also, transistor M2 is modeled by $C_{gsP}$ and a voltage controlled current source $g_{mP}*V_{gsP}$. Let RB be the resistance added in the faster signal traveling path ($V_{IN} \rightarrow V_1 \rightarrow V_{OUT}$) in order to match the speed with the slower signal traveling path ($V_{IN} \rightarrow V_2 \rightarrow V_{OUT}$). Also, consider $V_{OUT}$ as output node $AB_{OUT}$ in FIG. 2.

Figure 5:
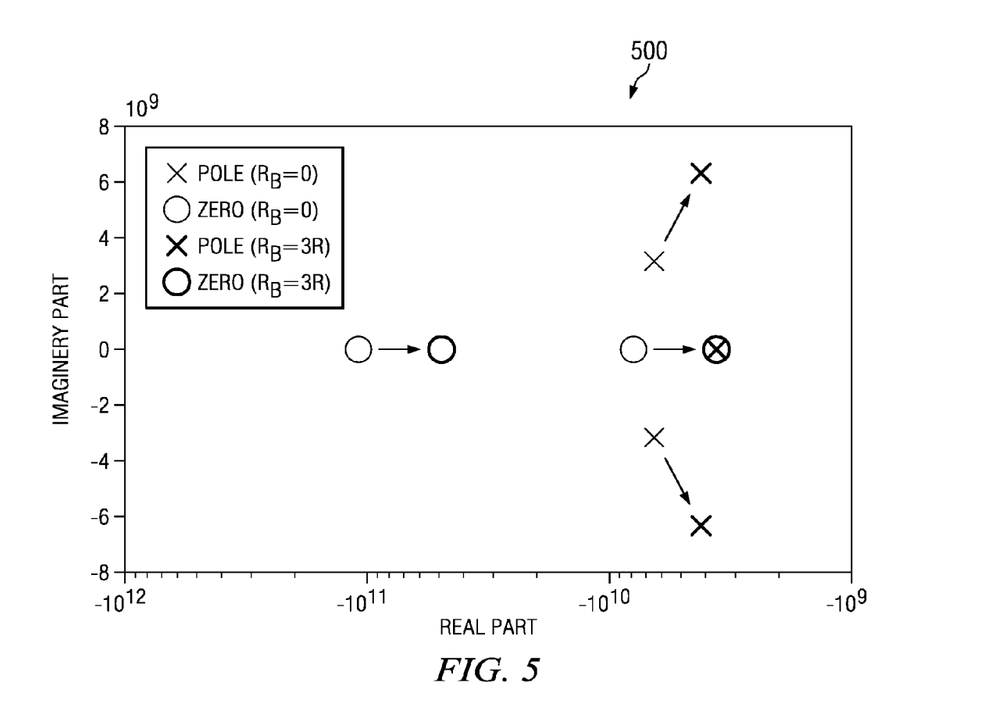
FIG. 5 is a graph illustrating a pole zero map obtained during the operation of the class-AB driver shown in FIG. 2, according to an embodiment of the present invention.

It can be noted that without the additional resistance RB, the upper signal traveling path ($V_{IN} \rightarrow V_1 \rightarrow V_{OUT}$) is faster than the lower signal traveling path ($V_{IN} \rightarrow V_2 \rightarrow V_{OUT}$). Therefore, when the two signal traveling paths are combined at node Vout, a LHP close-in zero is generated (e.g., as illustrated in FIG. 5) due to imbalance between the two signal traveling paths.

Let us consider that the compensational resistance RB is added between the nodes $V_{IN}$ and $V_1$ (e.g., Nodes A and B respectively). Further, in order to simplify the derivation of transfer function associated with the simplified AC model 400 of the trans-linear loop 220 of the class-AB driver 200, let us assume the transistor M1 in upper signal traveling path is about 3× stronger than the transistor M2 in lower signal traveling path and $C_{gs}$ is 3× of $C_{gd}$. In these embodiments, the NMOS and PMOS are designed to have same drivability.

Therefore, the transfer function of the simplified AC model can be derived based on the following assumptions.

$g_{mN} = g_{mP} = g_m,$ $C_{gsP} = 3C_{gsN} = 3c_{gs},$ and $C_{gdP} = 3C_{gdN} = C_{gs}.$ The transfer function is given by $$\frac{V_{OUT}(s)}{V_{IN}(s)} = \frac{12C_{gs}^2(R_B + R_P)s^2 + 4C_{gs}(g_m R_B + 3g_m R_P + 3)s + 6g_m}{\begin{Bmatrix} 16C_{gs}^2 R_B R_P (C_{gs} + C_L)s^3 + \\ C_{gs}[C_{gs}(13R_B + 8g_m R_B R_P + 21R_P) + \\ 4C_L(3R_P + R_B)]s^2 + \\ [C_{gs}(5g_m R_B + 15g_m R_P + 12) + 3C_L]s + 6g_m \end{Bmatrix}}$$

When the speed balancing resistor RB is zero, the above transfer function represents a two-pole and two-zero system. One zero is located at a much higher frequency than all the other poles and zero. The other close-in zero is located at a little bit higher frequency than that complex conjugate pole pair. Therefore, the system approximately represents a two-pole one-zero system. When the speed balancing resistor RB of a particular size is selected, an extra pole is created which can be used to cancel out the close-in zero to improve the overall frequency response.

Also, from the above mentioned assumptions, it can be noted that the upper path has 3× smaller capacitance. Therefore, the two paths can be balanced by selecting the resistance RB three times of the RP, i.e., RB=3RP. Let us assume RB=3RP=3R. By substituting the value RB=3R and RP=R in the transfer function, then the transfer function becomes $$\frac{V_{OUT}(s)}{V_{IN}(s)} = \frac{4C_{gs}s + 2g_m}{\left\{\begin{array}{l}4RC_{gs}(C_{gs}+C_L)s^2 + \\ [2C_{gs}(g_mR+2)+C_L]s + 2g_m\end{array}\right\}}$$

In accordance with the above described procedure for the simplified AC model 400, a lower signal is received via a lower signal path starting from the $AB_{IN}$ and arriving at the $AB_{OUT}$ via the node A and the node C, and an upper signal is received via an upper signal path starting from the $AB_{IN}$ and arriving at the $AB_{OUT}$ via the node A, RB, and the node B. In these embodiments, the size of the RB is selected such that the upper signal has substantially same signal travel time as the lower signal to arrive at the $AB_{OUT}$.

FIG. 5 is a graph illustrating a pole zero map obtained during the operation of the class-AB driver 200 shown in FIG. 2, according to an embodiment of the present invention. Particularly, FIG. 5 depicts the pole zero locations when RB is zero and RB is 3R. In the example embodiment illustrated in FIG. 5, the "O" represents the zero's and "X" represents the poles. As shown in FIG. 5, one zero (e.g., "O" when $R_B$=0 in LHP) is located around the transit frequency far away from the complex conjugate poles.

Therefore, in the frequency band of interest, the system is approximately a pair of complex conjugate poles (e.g., poles when $R_B$=0) and one zero (e.g., "O" when $R_B$=0 in LHP close to the complex conjugate poles) system.

As shown in FIG. 5, the lighter lines represent the poles and zeros when the speed balancing resistor RB=0 (e.g., as illustrated in the class-AB driver 100 of FIG. 1) and thicker lines represent the poles and zeros when RB=3R (e.g., as illustrated in the class-AB driver 200 of FIG. 2). As described-above, a new pole is created by selecting the speed balancing resistor RB, as shown in FIG. 5. In one embodiment, the new pole (e.g., pole when RB=3R) is used to cancel the close-in zero on the LHP by properly selecting the value of the RB (e.g., RB=3R). As a result, the out-of-band attenuation can be improved by 20 db/dec, which is desirable as higher order harmonics are greatly attenuated resulting in a much cleaner output signal.

In another embodiment, by selecting the size of the RB, the complex conjugate pole moves to a higher frequency, resulting in a flatter in-band frequency response. Further, by selecting the RB, the complex conjugate poles' Q can be enhanced, which reduces the in-band gain drooping.

Figure 6:
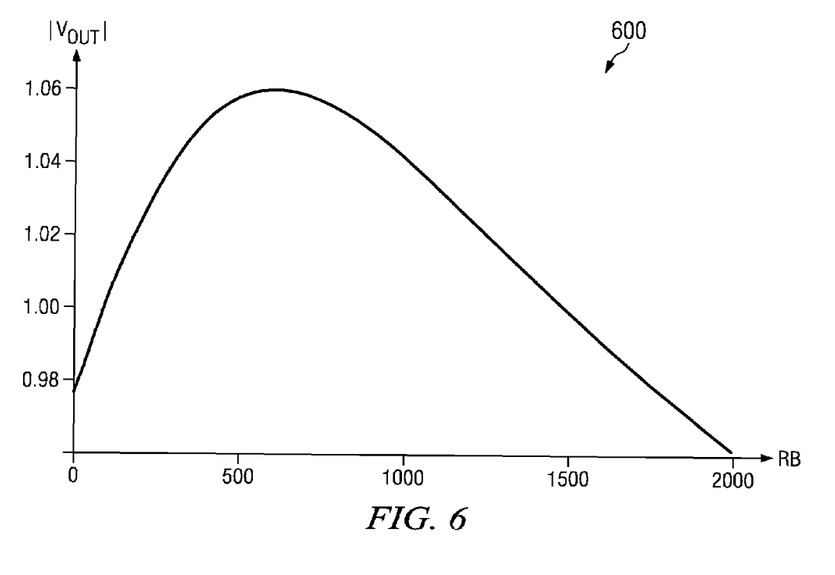
FIG. 6 is a graph showing equalization effect obtained by adjusting resistance of the class-AB driver shown in FIG. 2, according to an embodiment.

FIG. 6 is a graph showing equalization effect obtained by adjusting resistance of the class-AB driver shown in FIG. 2, according to an embodiment. FIG. 6 is a graph illustrating magnitude of $V_{OUT}$ at the band edge frequency (500 MHz) vs RB. By changing RB, the complex conjugate pole Q is actually adjusted to get some equalization fact.

Figure 7:
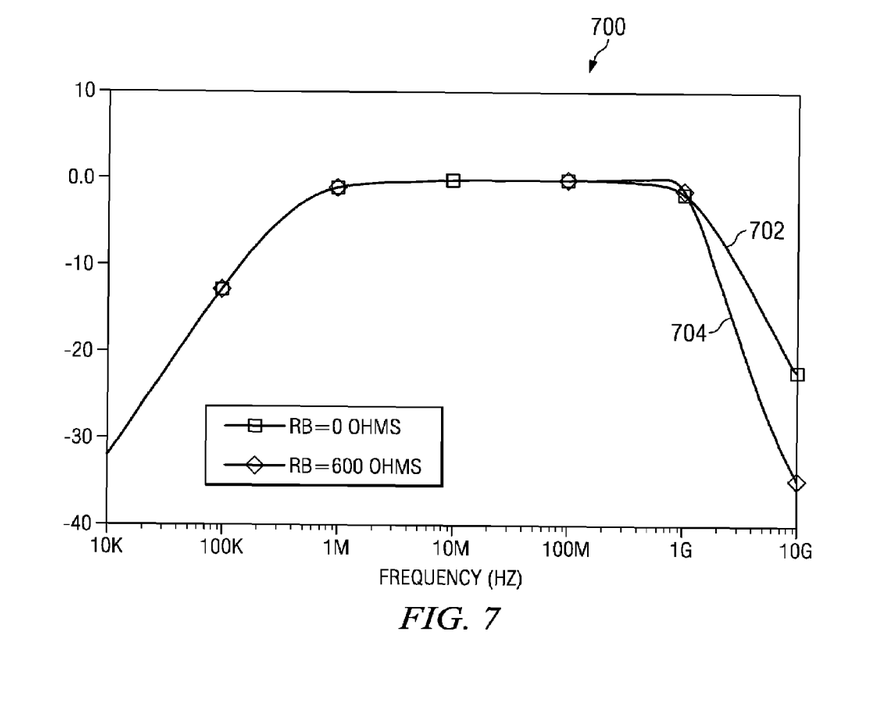
FIG. 7 is a graph showing the frequency response obtained from the class-AB drivers shown in FIG. 1 and FIG. 2, according to an embodiment.

FIG. 7 is a graph showing the frequency response obtained from the class-AB drivers 100 and 200 shown in FIG. 1 and FIG. 2 respectively, according to an embodiment. As shown in FIG. 7, the curve 702 represents the frequency response when the $R_B$=zero and the curve 704 represents the frequency response when the $R_B$=3R. It is apparent that, the out-of-band attenuation is increased and the in-band frequency response is flatter as shown in curve 704 when compared to the curve 702.

In accordance with the above-described procedure, the performance summary of the proposed class-AB driver 200 is illustrated as follows. The following Table 1 entitled "Performance Summary of the class-AB driver" may provide a performance analysis of the class-AB driver 200 which is designed with one 0.35 um technology and simulated with and without RB across corner combinations including WEAK, NOM, and STRONG corners. For example, the STRONG corner means the strong process, −40° C., and 5.5V supply corner combination. The WEAK corner means the weak process, 125° C., and 4.5V corner combination. The NOM corner corresponds to the nominal process, 70° C., and 5V corner combination.

In this example, the in-band gain variation reduction and out-band attenuation increasing are consistent across all the corners. For example, and with reference to the Table 1, for the NOM corner, the in-band gain variation is reduced from 9.5% to 2.4%. For the same 1.2 VPP output signal, with RB compensation, the required input changes from 1.43 VPP at 250 MHz to 1.46 VPP at 450 MHz, while without RB compensation, the required input changes from 1.49 VPP at 250 MHz to 1.60 VPP at 450 MHz. Further, it can been seen from the below Table 1 that with RB compensation, the output signal's THDs are also improved due to 20 dB/dec more out-band attenuation. In addition, the THD gets improved at the band edge (450 MHz), from 5.31% to 2.52% at the NOM corner.

TABLE 1

Performance Summary of the class-AB Driver

| Parameters | WEAK | NOM | STRONG | Unit |
| --- | --- | --- | --- | --- |
| Supply Voltage | 4.5 | 5 | 5.5 | V |
| Quiescent Current | 8.31 | 9.84 | 10.74 | mA |
| Load (mainly capacitive) | | 5 | | pF |
| 200~500 MHz in-band Gain Variation w/o RB | 14.7 | 9.5 | 5.8 | % |
| 200~500 MHz in-band Gain Variation w/ RB | 7.7 | 2.4 | 1.0 | % |
| THD @ 250 MHz, 1.2 VPP output w/o RB | 1.22 | 1.55 | 1.94 | % |
| Vin for 1.2 VPP output w/o RB | 1.51 | 1.49 | 1.49 | VPP |
| THD @ 250 MHz, 1.2 VPP output w/ RB | 1.03 | 1.21 | 1.65 | % |
| Vin for 1.2 VPP output w/ RB | 1.48 | 1.43 | 1.40 | VPP |
| THD @ 352 MHz, 1.2 VPP output w/o RB | 2.43 | 3.11 | 4.42 | % |
| Vin for 1.2 VPP output w/o RB | 1.54 | 1.53 | 1.57 | VPP |
| THD @ 352 MHz, 1.2 VPP output w/ RB | 1.84 | 1.86 | 2.49 | % |
| Vin for 1.2 VPP output w/ RB | 1.48 | 1.43 | 1.40 | VPP |
| THD @ 450 MHz, 1.2 VPP output w/o RB | 4.22 | 5.31 | 7.86 | % |
| Vin for 1.2 VPP output w/o RB | 1.58 | 1.60 | 1.70 | VPP |
| THD @ 450 MHz, 1.2 VPP output w/ RB | 2.62 | 2.52 | 3.31 | % |
| Vin for 1.2 VPP output w/ RB | 1.49 | 1.46 | 1.49 | VPP |

The above-described class-AB driver works substantially without consuming any additional power. Further, the out-ofband attenuation can be increased by 20 dB/dec resulting in a much cleaner output signal. The remained complex conjugate pole pair of the above class-AB driver has been pushed to higher frequency resulting in a flatter in-band frequency response, i.e., less in-band attenuation at higher in-band frequency as shown in FIG. 7. The remained complex conjugate pole pair's Q can be adjusted in such a way that the in-band frequency response can be tilted up instead of dropping down, which can reduce the gain compensation requirement on the equalizer when needed. The above technique is not sensitive to the absolute value of the resistance used. Furthermore, the MOS type of transistors (e.g., shown in FIG. 3), are used instead of the speed balancing resistor RB (e.g., shown in FIG. 2) to track the PVT variations.

Although the present embodiments have been described with reference to specific example embodiments, it will be evident that various modifications and changes may be made to these embodiments without departing from the broader spirit and scope of the various embodiments. For example, the various devices, modules, analyzers, generators, etc. described herein may be enabled and operated using hardware circuitry (e.g., CMOS based logic circuitry), firmware, software and/or any combination of hardware, firmware, and/or software (e.g., embodied in a machine readable medium). For example, the various electrical structure and methods may be embodied using transistors, logic gates, and electrical circuits (e.g., application specific integrated ASIC circuitry).

What is claimed is:

1. A class-AB driver having a signal input terminal $AB_{IN}$ and a signal output terminal $AB_{OUT}$, comprising:
    a push-pull output stage coupled to the signal output terminal and wherein the push-pull output stage includes a first transistor M1 having a first electrode, a second electrode and a control electrode and a second transistor M2 having a first electrode, a second electrode, and a control electrode, and wherein the second electrode of M1 and the first electrode of M2 are coupled to the $AB_{OUT}$;
    a trans-linear loop including the push-pull output stage and wherein the trans-linear loop includes a third transistor M3 having a first electrode, a second electrode and a control electrode, a fourth transistor M4 having a first electrode, a second electrode and a control electrode, and a speed balancing resistor RB having an input and an output, wherein the control electrode of M3, the input of RB and the $AB_{IN}$ are coupled at node A, wherein the output of RB is coupled to the control electrode of M1 at node B, and the second electrode of M4 and the control electrode of M2 are coupled at node C;
    an input stage coupled to the $AB_{IN}$, and the trans-linear loop; and
    a current biasing and enabling circuit coupled to the input stage and the signal output terminal, wherein an upper signal path starting from the $AB_{IN}$ and arriving at the $AB_{OUT}$ via the node A, RB, and the node B and a lower signal path starting from the $AB_{IN}$ and arriving at the $AB_{OUT}$ via the node A and the node C have substantially similar signal travel time.

2. The class-AB driver of claim 1, wherein the transistors M1, and M3 are the same one type of transistors, and M2 and M4 are the same complementary type of transistors.

3. The class-AB driver of claim 2, wherein the transistors M1, M2, M3, and M4 are selected from the group consisting of CMOS transistors and bipolar transistors.

4. The class-AB driver of claim 1, wherein the second electrode of M3 is coupled to the first electrode of M4.

5. The class-AB driver of claim 4, wherein the input stage includes a fifth transistor M5 having a first electrode, a second electrode and a control electrode and a sixth transistor M6 having a first electrode, a second electrode and a control electrode and wherein the second electrode of M5 is coupled to the node A and the first electrode of M6 is coupled to the control electrode of M4.

6. The class-AB driver of claim 5, wherein the control electrode of M6 is coupled to the current biasing and enabling circuit and the control electrode of M5 is coupled to the $AB_{IN}$.

7. The class-AB driver of claim 5, wherein the transistors M5 and M6 are selected from the group consisting of CMOS transistors and bipolar transistors.

8. A class-AB driver having a signal input terminal $AB_{IN}$, and a signal output terminal $AB_{OUT}$, comprising:
    a push-pull output stage coupled to the signal output terminal and wherein the push-pull output stage includes a first transistor M1 having a first electrode, a second electrode and a control electrode and a second transistor M2 having a first electrode, a second electrode, and a control electrode, and wherein the second electrode of M1 and the first electrode of M2 are coupled to the $AB_{OUT}$;
    a trans-linear loop including the push-pull output stage and wherein the trans-linear loop includes a third transistor M3 having a first electrode, a second electrode and a control electrode, a fourth transistor M4 having a first electrode, a second electrode and a control electrode, a tenth transistor M10 having a first electrode, a second electrode and a control electrode, and an eleventh transistor M11 having a first electrode, a second electrode and a control electrode, wherein the control electrode of M3, the second electrode of M10 and the $AB_{IN}$ are coupled at node A, wherein the second electrode of M11 is coupled to the control electrode of M1 at node B, and the second electrode of M4 and the control electrode of M2 are coupled at node C;
    an input stage coupled to the $AB_{IN}$, and the trans-linear loop; and
    a current biasing and enabling circuit coupled to the input stage and the signal output terminal, wherein an upper signal path starting from the $AB_{IN}$ and arriving at the $AB_{OUT}$ via the node A, M10, M11, and the node B and a lower signal path starting from the $AB_{IN}$ and arriving at the $AB_{OUT}$ via the node A and the node C have substantially similar signal travel times.

9. The class-AB driver of claim 8, wherein the second electrode of M3 is coupled to the first electrode of M4 and the first electrode of M10 is coupled to the first electrode of M11.

10. The class-AB driver of claim 8, wherein the input stage includes a fifth transistor M5 having a first electrode, a second electrode and a control electrode and a sixth transistor M6 having a first electrode, a second electrode and a control electrode and wherein the second electrode of M5 is coupled to the node A and the first electrode of M6 is coupled to the control electrode of M4.

11. The class-AB driver of claim 10, wherein the control electrode of M6 is coupled to the current biasing and enabling circuit and the control electrode of M5 is coupled to the $AB_{IN}$.

12. The class-AB driver of claim 10, wherein in the transistors M1, M3, M5, M6 and M10 are the same one type of transistors and M2, M4, and M11 are the same complementary type of transistors.

13. The class-AB driver of claim 10, wherein the transistors M1, M2, M3, M4, M5, M6, M10, and M11 are selected from the group consisting of CMOS transistors and bipolar transistors.

14. A method of delivering current/power using a class-AB driver circuit, wherein the class-AB driver circuit having a push-pull output stage, a trans-linear loop having a tenth transistor M10, an eleventh transistor M11, an input stage, a current biasing and enabling circuit, wherein the trans-linear loop is coupled to a signal input terminal $AB_{IN}$ via node A, and wherein the push-pull output stage is coupled to the trans-linear loop via node B and node C, comprising:

receiving a lower signal via a lower signal path starting from the $AB_{IN}$ and arriving at $AB_{OUT}$ via the node A and the node C; and receiving an upper signal via a upper signal path starting from the $AB_{IN}$ and arriving at the $AB_{OUT}$ via the node A, M10, M11, and the node B, wherein the sizes of the M10 and M11 are selected such that the upper signal has substantially same signal travel time as the lower signal to arrive at $AB_{OUT}$.

15. A method of delivering current/power using a class-AB driver having a push-pull output stage, a trans-linear loop having a simple resistor RB, an input stage, a current biasing and enabling circuit, wherein the trans-linear loop is coupled to a signal input terminal $AB_{IN}$ via node A, and wherein the push-pull output stage is coupled to the trans-linear loop via node B and node C, comprising:

receiving a lower signal via a signal path starting from the $AB_{IN}$ and arriving at a signal output terminal $AB_{OUT}$ via the node A and the node C; and receiving an upper signal via a upper signal path starting from the $AB_{IN}$ and arriving at the $AB_{OUT}$ via the node A, RB, and the node B, wherein the size of the RB is selected such that the upper signal has substantially same signal travel time as the lower signal to arrive at $AB_{OUT}$.

* * * * *